United States Patent
Yasmeen et al.

(10) Patent No.: US 8,012,319 B2
(45) Date of Patent: Sep. 6, 2011

(54) MULTI-CHAMBERED METAL ELECTRODEPOSITION SYSTEM FOR SEMICONDUCTOR SUBSTRATES

(75) Inventors: Nishath Yasmeen, Houston, TX (US); Richard Aaron Ledesma, Tomball, TX (US)

(73) Assignee: Texas Instruments Incorporated, Dallas, TX (US)

( * ) Notice: Subject to any disclaimer, the term of this patent is extended or adjusted under 35 U.S.C. 154(b) by 912 days.

(21) Appl. No.: 11/943,644

(22) Filed: Nov. 21, 2007

(65) Prior Publication Data
US 2009/0127122 A1 May 21, 2009

(51) Int. Cl.
*C25D 17/00* (2006.01)
*C25D 5/00* (2006.01)
(52) U.S. Cl. ............ 204/242; 205/96; 205/157
(58) Field of Classification Search ........... 204/242
See application file for complete search history.

(56) References Cited

U.S. PATENT DOCUMENTS

| | | | |
|---|---|---|---|
| 4,696,729 A * | 9/1987 | Santini | 204/224 R |
| 6,179,983 B1 * | 1/2001 | Reid et al. | 205/96 |
| 6,261,426 B1 * | 7/2001 | Uzoh et al. | 204/224 R |
| 6,683,380 B2 | 1/2004 | Efland et al. | |
| 6,768,194 B2 * | 7/2004 | Wan | 257/707 |
| 6,811,669 B2 * | 11/2004 | Gonzalez et al. | 205/96 |
| 2001/0054556 A1 * | 12/2001 | Nakamoto et al. | 205/96 |
| 2003/0168340 A1 * | 9/2003 | Kaja et al. | 205/96 |
| 2004/0262150 A1 * | 12/2004 | Yajima et al. | 204/224 R |
| 2006/0226018 A1 * | 10/2006 | Iwazaki | 205/148 |

FOREIGN PATENT DOCUMENTS

JP 04032597 A * 2/1992

OTHER PUBLICATIONS

English Abstract of JP 04-032597A.*

* cited by examiner

*Primary Examiner* — Harry D Wilkins, III
*Assistant Examiner* — Bryan D. Ripa
(74) *Attorney, Agent, or Firm* — John J. Patti; Wade J. Brady, III; Frederick J. Telecky, Jr.

(57) ABSTRACT

A multi-chambered system for electroplating metal layers on a semiconductor substrate. The system comprises a fluid reservoir having at least a first chamber and a second chamber. A cathode is located in the first chamber, an anode is located in the second chamber, and a shield is located between the cathode and anode. The cathode is configured to be electrically coupled to a semiconductor substrate locatable in the first chamber. The anode is configured to oppose a first major surface of the semiconductor substrate. The shield is configured to deter electrolytic fluid communication between the first and second chamber, other than through predefined openings in the shield.

21 Claims, 8 Drawing Sheets

MULTI-CHAMBERED METAL ELECTRODEPOSITION SYSTEM FOR SEMICONDUCTOR SUBSTRATES

TECHNICAL FIELD

The disclosure is directed, in general, to semiconductor devices, and more particularly, to systems and methods for the electrochemical deposition of metal layers in the manufacture of semiconductor devices.

BACKGROUND

The deposition of metal layers is an important aspect of semiconductor device fabrication. For instance, the fabrication of bonding surfaces over integrated circuits (IC) typically includes the deposition of metal layers by electroplating, or electrochemical deposition (ECD) The ECD process typically involves placing a semiconductor substrate having a plurality of ICs on its surface into a single-chambered ECD system and applying a voltage between an anode and cathode of the system.

SUMMARY

The disclosure provides a multi-chambered system for electroplating metal layers on a semiconductor substrate. The system comprises a fluid reservoir having at least a first chamber and a second chamber. A cathode is located in the first chamber, an anode is located in the second chamber, and a shield is located between the cathode and anode. The cathode is configured to be electrically coupled to a semiconductor substrate locatable in the first chamber. The anode is configured to oppose a first major surface of the semiconductor substrate. The shield is configured to deter electric current flow between the first chamber and the second chamber, other than though predefined openings in the shield.

In some embodiments of the system, the above-described fluid reservoir includes further includes at least one inlet port located in the second chamber and at least one outlet port located in the first chamber.

Another embodiment comprises a method of manufacturing a semiconductor devices. The method comprises forming a plurality of integrated circuits on a substrate surface. Forming the integrated circuits includes forming interconnect structures located on uppermost insulating layers of each of the integrated circuits. The method further includes electrochemically depositing one or more metal layer on the interconnect structures. Electrochemically depositing the one or more metal layer includes placing a shield between a cathode and an anode located in first and second chambers, respectively, of a fluid reservoir. The shield is configured to deter electric current flow between the first chamber and the second chamber, other than though predefined openings in the shield. Electrochemically depositing the one or more metal layer also includes placing an electrolytic fluid in the first and second chambers and coupling the substrate to a cathode located in the first chamber, the substrate being located between the cathode and the anode located in the second chamber. Electrochemically depositing the one or more metal layer further includes establishing an electric field between the cathode and the anode to thereby deposit the metal layer.

BRIEF DESCRIPTION OF DRAWINGS

The disclosure is described with reference to example embodiments and to accompanying drawings, wherein.

DETAILED DESCRIPTION

The present disclosure benefits from the recognition that certain conventional ECD processes result in metal layers having non-uniform thickness. For example, in some cases, a metal layer deposited at or near the edges of a semiconductor substrate (e.g., a wafer) can be an order of magnitude thicker than at or near the substrate's center. The non-uniform thickness of the metal layer can result in the production of defective semiconductor devices from such substrates, thus reducing production yields and causing in-field reliability problems. E.g., bonding surfaces formed on ICs located at or near the edges of the substrate can have an excessive thickness as compared to bonding surfaces formed on ICs located at or near the center of the substrate. It is further recognized as part of the present disclosure, the non-uniform deposition of metal thicknesses on a substrate can be caused by having a non-uniform current density at the surface of the wafer being metal-plated.

To address these issues, the present disclosure present a multi-chambered ECD system that is configured to plate metal layers onto a semiconductor substrate with improved uniformity as compared to previous single-chamber designs. The multi-chambered ECD system can have a combination of features that work in cooperation with each other to facilitate the deposition of metal layers of uniform thickness across the entire surface of a substrate.

Figure 1:
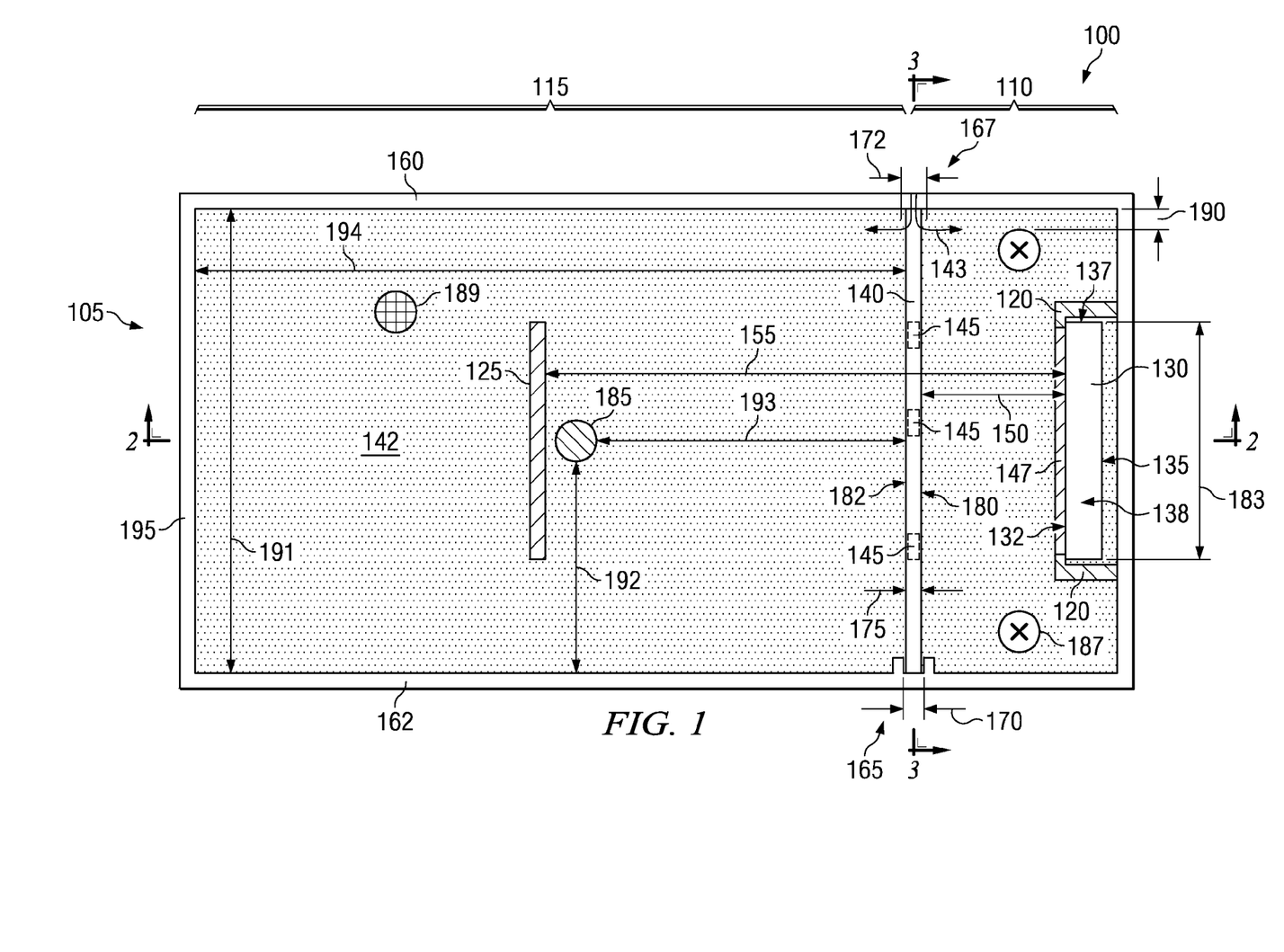
FIG. 1 presents a plan view of an example multi-chambered system for electroplating metal layers on a semiconductor substrate.
Figure 2:
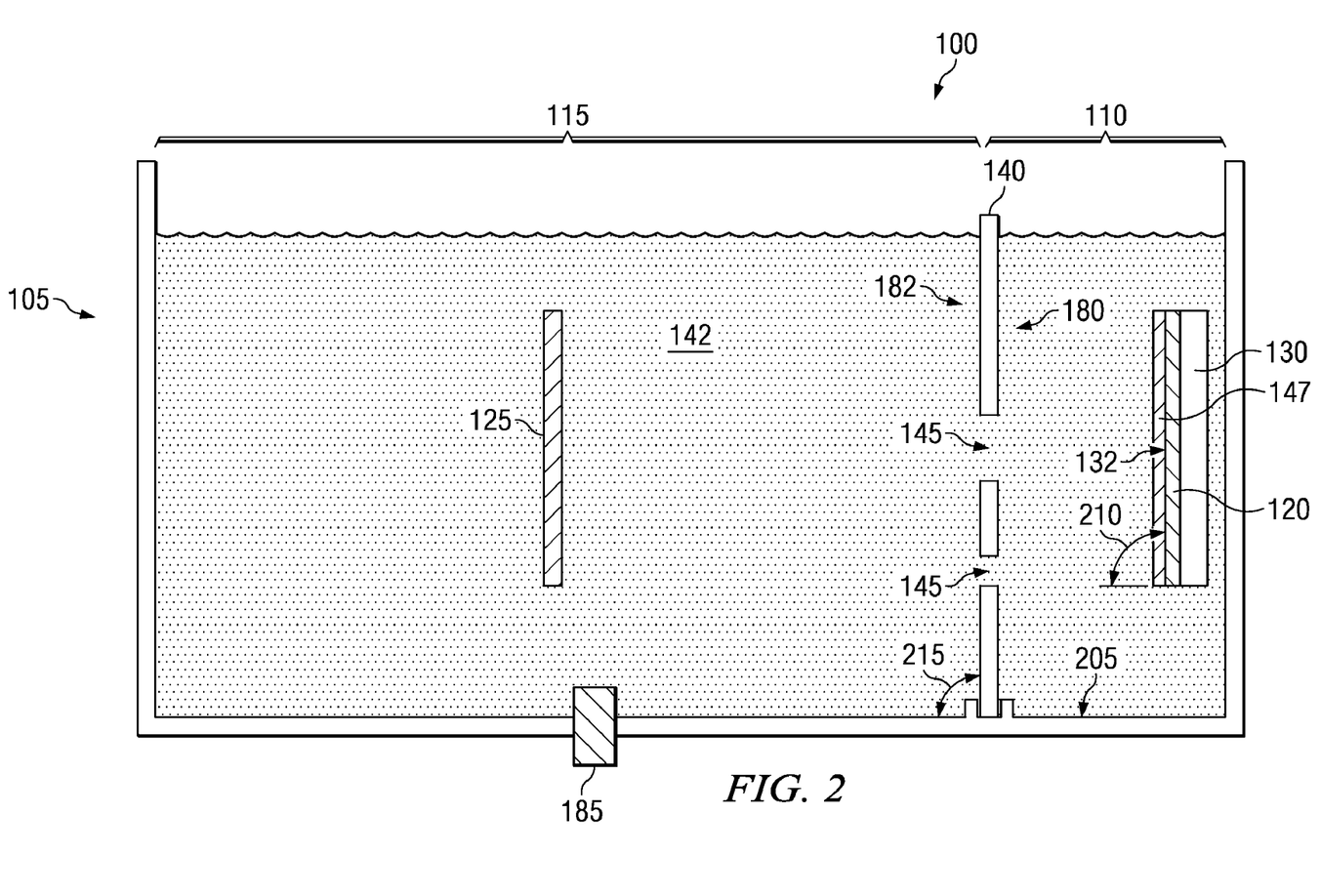
FIG. 2 presents a cross-sectional view of the example multi-chambered system through view line 2-2 shown in FIG. 1.
Figure 3:
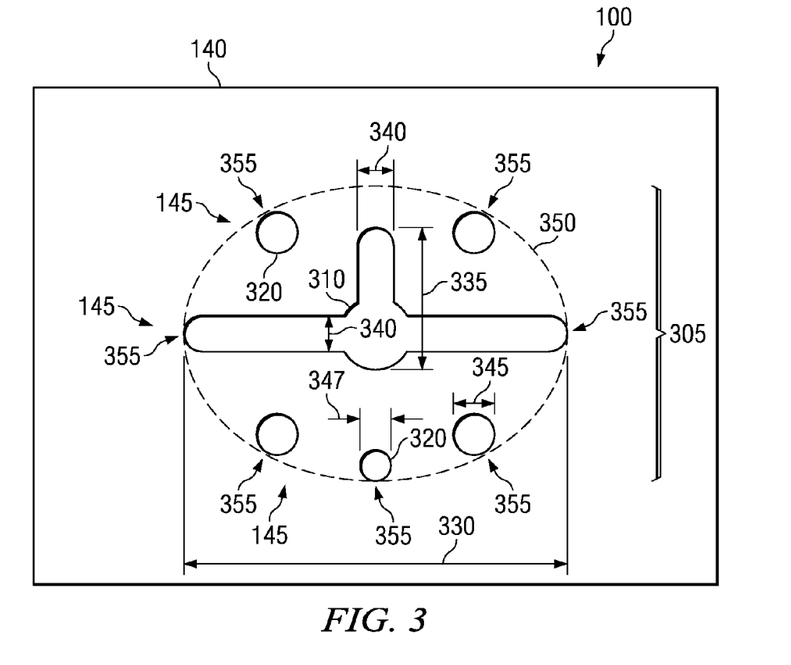
FIG. 3 presents a cross-sectional view of an example multi-chambered system through view line 3-3 shown in FIG. 1.

FIG. 1 presents a plan view of an example multi-chambered ECD system 100 of the disclosure. FIGS. 2 and 3 present a cross-sectional views of the system 100 shown in FIG. 1, through view line 2-2 and 3-3, respectively. The system 100 comprises a fluid reservoir 105 having at least a first chamber 110 and a second chamber 115. A cathode 120 is located in the first chamber 110, and an anode 125 is located in the second chamber 115.

The first chamber 110 is configured to hold a semiconductor substrate 130 designated for metal layer deposition. The cathode 120 is configured to be electrically coupled to a semiconductor substrate 130 locatable in the first chamber 110. For example, as illustrated in FIG. 1, the cathode 120 can be configured to have one or more pins that can contact and hold the semiconductor substrate 130 in place in the reservoir 105. One skilled in the art would understand how additional non-conductive structures (not shown) could be used to secure the cathode 120 and substrate 130 in the reservoir 105. In some cases, the substrate 130 is considered to be part of the cathode 120.

Figure 4:
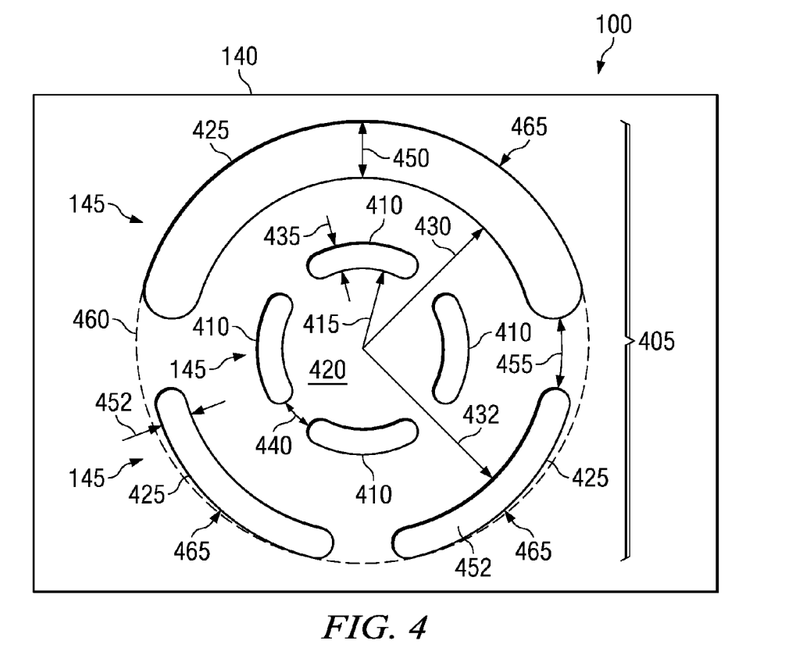
FIG. 4 presents a cross-sectional view of an alternative example shield of the multi-chambered system shown in FIG. 1, through view line 3-3.

The anode 125 is configured to oppose a first major surface 132 of the semiconductor substrate 130. In some configurations of the system 100, such as shown in FIG. 1, the first major surface 132 of the substrate 130 can directly contact the cathode 120. In still other cases, the second major surface 135 or the edge 137 of the substrate 130 can contact the cathode 120. As illustrated in FIG. 4, the central region 138 of the substrate 130 may not directly contact the cathodes 120. One skilled in the art would be familiar with other means of electrically coupling the substrate 130 to the cathode 120.

The system 100 further includes a shield 140 located between the cathode 120 and the anode 125. The shield 140 separates the first and second chambers 110, 115. The shield 140 is configured to deter electrolytic fluid 142 (FIG. 1) communication between first and second chambers 110, 115, other than through predefined openings 145 in the shield 140. The predefined openings 145 can be configured to adjust the electric field at the substrate's major surface 132 so as to improve the uniformity of metal layer 147 deposited on the surface.

It was discovered, as part of the present disclosure, that minimizing the fluid 142 (FIG. 1) communication between chambers 110, 115, other than through the predefined openings, was an important factor in improving the uniformity of metal deposition on the substrate 130. Deterring such peripheral fluid 142 communication between chambers 110, 115, in turn, deters peripheral electric current flow 143 between the chambers 110, 115. Peripheral electric current flow 143 can cause non-uniform metal deposition onto the substrate 130. Consequently, regulating peripheral fluid 142 flow, and deterring peripheral electric current flow 143, between chambers 110, 115 are newly discovered result-effective variables that can be used to control the uniformity of metal deposition onto the substrate 130. While not limiting the scope of the disclosure to theory, it is believed that peripheral fluid 142 communication, and consequently, peripheral electric current flow 143, can alter the electric field lines at the substrate's deposition surface 132 so as to contribute to non-uniform metal deposition at the surface 132.

For instance, consider the system 100 when all of the predefined openings 145 are blocked (e.g., plugged or covered), and there is a potential difference between the anode and cathode. The peripheral electric current flow 143 between chambers 110, 115 can be less than about 18 percent as compared to the current flow between chambers 110, 115 when the predefined openings 145 are not blocked. E.g., consider an embodiment of the system 100, when the predefined openings 145 are unblocked, and the electric current flow between chambers 110, 115 equals about 4.1 Amps. When the predefined openings 145 for such an embodiment are blocked, then the peripheral electric current flow 143 between chambers preferably can equal about 0.8 Amps.

It was also discovered as part of the present disclosure, that the uniformity of metal layer 147 deposition was improved when the shield 140 is closer to the cathode 120 than to the anode 125. That is, the distance 150 between shield 140 and cathode 120 is another newly discovered result-effective variable that can be used to control the uniformity of metal deposition onto the substrate 130. In particular, a distance 150 between shield 140 and cathode 120 ranging from less than about 50 to about 35 percent of a distance 155 between the cathode 120 and anode 125, improved the uniformity of metal deposition. E.g., in some embodiments of the system 100, when the cathode-anode distance 155 equals about 16.6 cm, the shield-cathode distance 150 can equal about 7.5 cm. The specific and relative shield-cathode distance 150 can be adjusted to optimize uniform metal deposition in systems 100 having different sizes of fluid reservoirs 105, chambers 115, 120 and substrates 130.

In some embodiments, a shield-cathode distance 150 of greater than 50 percent of the cathode-anode distance 155 resulted in more metal being deposited near the substrate's 130 edge 135 than the central region 138. In other cases, a shield-cathode distance 150 of less than about 35 percent of the cathode-anode distance 155 resulted in more metal being deposited near the substrate's 130 central region 138 than the edges 135.

In some cases, the shield 140 is welded, bolted or otherwise permanently coupled to outer walls 160, 162 of the fluid reservoir 105. In other cases, it is desirable for the shield 140 to be removably coupled to the outer walls 160, 162. A removable shield 140 has the advantage of permitting different shields, having different patterns of predefined openings 145, to be used in the same fluid reservoir 105. The use of different patterns of predefined openings 145, in turn, can be used to improve the uniformity of metal deposition onto different sizes of substrate 130. This allows a single system 100 to have multiple applications, thereby providing a cost and space savings to a semiconductor device fabrication facility designed to process a plurality of differently-sized substrates per day.

For illustrative purposes, FIG. 1 depicts two different means of removably coupling the shield 140 to the reservoir's 105 outer walls 160. Opposing outer walls 160, 162 of the reservoir 105 can include slots 165 or grooves 167 that are configured to removably hold the shield 140. For instance, an internal width 170 of the slot 165, or an internal width 172 of the grove 167 can be made slightly larger than a thickness 175 of the shield 140, such that the shield 140 can slide into and be held in place by, the slots 165 or groves 167. If the width 170 or distance 172 is much larger than the shield's thickness 175, fluid 142 communication between the chambers 110, 115 is excessive, resulting in poor control of the electric field applied to the first surface. In some cases, to suitable deter such peripheral fluid flow, the slot's width 170 or groove's internal width 172 ranges from about 1 percent to 5 percent larger than the shield's thickness 175. For example, in some cases, when the shield's thickness 175 equals about 0.5 cm, then the slot's internal width 170 equals about 0.505 to about 0.525 cm. The groove's internal distance 172 can have a similar range of values.

As illustrated in FIG. 2, it is preferable for the substrate 130 and shield 140 to be vertically oriented in the fluid reservoir 105. As also shown in FIG. 2, the fluid reservoir 105 can be open to the atmosphere. The term vertically oriented, as used herein, means that the major surfaces 132, 135 of the substrate 130, or surfaces 180, 182 of the shield 140, are substantially perpendicular to a planer floor 205 of the reservoir 105. For example, an acute angle 210 between the floor 205 and the substrate's major surface 132 can range from about 80 to 100 degrees. The acute angle 215 between the floor 205 and the shield's major surface 180 can similarly range from about 80 to 100 degrees. Having a vertical substrate 130 and shield 140 orientation and open fluid reservoir 105 are conducive to the rapid exchange of successively plated substrates 130. A vertical orientation also simplifies the exchange of shields 140, if desired. Additionally, fluid reservoirs 105 having such a configuration are inherently more economical to build and maintain than certain closed ECD systems.

The selection of a particular pattern 305 (FIG. 3) of predefined openings 145 in the shield 140 is important to increasing the homogeneity of electric field lines at the substrate's major surface 132 (FIG. 2), thereby improving the uniformity of metal deposition across the substrate 130. As part of the present disclosure, it was discovered that the particular pattern of openings 145 to facilitate uniform metal deposition differs depending on the size of the substrate 130 being electrodeposited with metal.

FIG. 3 shows an example desirable pattern 305 of predefined openings 145 in the shield 140 when depositing metal onto a semiconductor substrate 130 that is a 150 mm diameter 183 wafer (FIG. 2). As illustrated, the pattern area is generally oval in shape (as confined by perimeter or periphery 350) having a major axis (running along its longest "diameter") and a minor axis (running along its shortest "diameter"). This pattern area includes pattern 305, and the pattern 305 can include a centrally located inverted "T" opening 310 and a plurality of circular openings 320 can be located peripherally above and below the inverted "T" opening 310. This "T" opening 310 generally includes an elongated opening along the major axis that intersects an elongated opening along the minor axis at the center of the pattern area. In some embodiments, the inverted "T" has a horizontal length 330 ranging from about 9 to 11 cm, vertical length 335 ranging from about 3.6 to 4 cm and interior width 340 ranging from about 0.8 to 1.1 cm. In some embodiments, the circular openings 320 have diameters 345, 347 ranging from about 0.6 to 1.3 cm.

FIG. 4 presents a cross-sectional view of an alternative example shield 140, also through view line 3-3 of FIG. 1. FIG. 4 shows a desirable alternative pattern 405 (which has a generally circular pattern area) of predefined openings 145 in the shield 140 when depositing metal onto a semiconductor substrate 130 that is a 200 mm diameter 183 wafer (FIG. 2). The alternative pattern 405 can include first semi-circular openings 410 located a first radial distance 415 from a central region 420. The central region 420 of the shield 140 has no openings. That is, there are no openings located more centrally in the shield 140 than the first semi-circular openings 410. As illustrated, the first semi-circular openings 410 are angularly spaced apart from one another. The pattern 405 also includes second semi-circular openings 425 (which is generally elongated and extends along the periphery or perimeter 460 of the generally circular pattern area), the openings 425 are located second radial distances 430, 432 from the central region 420 of the shield 140, and similarly angularly spaced apart from one another. The second radial distance 430 is greater than the first radial distance 415.

In some embodiments, the first semi-circular openings 410 have a radial distance 415 ranging from about 3 to 4 cm, interior widths 435 ranging from about 1 to 1.5 cm, and semicircular spacings 440 ranging from about 1 to 1.5 cm. In some cases, the second semi-circular openings 425 have radial distances 430, 432 ranging from about 6 to 8 cm, interior widths 450, 452 ranging from about 1 to 2.6 cm, and semicircular spacings 455 ranging from about 2 to 3 cm.

It was discovered as part of the present disclosure that it is desirable for the predefined openings 145 (e.g., FIG. 2) to be adjusted in size and number so as to be confined to an area that is smaller than a target electroplating area (e.g., major surface 132 in FIG. 2) of the semiconductor substrate 130. Such an arrangement facilitates more uniform metal deposition across the substrate, as compared to cases where the set of predefined openings 145 are not confined to an area that is smaller than a target electroplating area.

For example, the pattern 305 of predefined openings 145 in FIG. 3 delineate an outer perimeter 350. As illustrated, the outer perimeter 350 share outer edges 355 of the outermost openings 310, 320 of the pattern 305. Preferably, the area within the outer perimeter 350 is less than the target area of the substrate 130 being plated (e.g., major surface 132, FIG. 2). Similarly, for the set of predefined openings 145 in FIG. 4, the second semicircular openings 425 delineate an outer perimeter 460 that shares outer edges 465 of the outer-most openings 425 of the set. Again, it is preferable for the area within outer perimeter 460 to be less than the target area of the substrate being plated.

It was further discovered as part of the present disclosure that the locations of electrolytic fluid inlet and outlet ports in the chambers 110, 115 are important factors influencing the uniformity of metal deposition onto the substrate 130. It was also discovered that the particular position and number of inlet and outlet ports within the chambers also were important factors influencing the uniformity of metal deposition onto the substrate. That is, inlet and outlet port location, position and number are newly discovered result-effective variables that can be used to control the uniformity of metal deposition onto the substrate.

While not limiting the scope of the disclosure by theory, it is believed that inlet and outlet port location, position and number have an important influence on the extent of laminar flow of the electrolytic fluid in the chambers. It is further believed that laminar electrolytic fluid flow in the chambers promoted uniform metal deposition onto the substrate. In comparison, turbulent electrolytic fluid flow in the chambers, as characterized, e.g., by the presence of bubbles and foam in the chamber, can promote non-uniform metal deposition.

FIG. 1 shows an embodiment of the fluid reservoir 105 that further includes at least one inlet port 185 located in the second chamber 115, and at least one outlet port 187 located in the first chamber 110. The term inlet port 185 and outlet port 187 as used herein refer to the fluid conduits that serve to transfer the electrolytic fluid 142 into and out of the fluid reservoir 105 during the system's 100 operation to plate a metal layer 147 onto the substrate's 130 surface 110. The inlet and outlet ports 185, 187 are different than one or more optional service drains 189 in one or both of the chambers 110, 115. The service drains 189 can facilitate the entire removal of fluid 105 from the reservoir 105 for, e.g., the maintenance and cleaning of the system 100.

As further illustrated in FIG. 1, laminar fluid flow, and hence improved metal deposition, is facilitated when the at least one outlet port 187 is positioned near an outer wall 160 of the fluid reservoir 105. For example, in some embodiments, a distance 190 between the outlet port 187 and the nearest outer wall (e.g., wall 160) equals about 5 percent or less than a distance 191 between opposing outer walls 160, 162 of the reservoir 105. As further illustrated in FIG. 1, there can be two outlet ports 187, each being positioned near one of the opposing outer walls 160, 162 of the fluid reservoir 105.

As also illustrated in FIG. 1, there can be at least one inlet port 185 that is centrally located in the fluid reservoir 105. Such an arrangement can facilitate laminar fluid flow, and hence, improved metal deposition. In some cases, a distance 192 between the inlet port 185 and nearest outer wall 160 is between about 40 and 60 percent of the distance 191 between opposing outer walls 160, 162. In some embodiments, the inlet port 185 is similarly centrally located with respect to the shield 140 because this promotes laminar fluid 142 flow. For example, in some cases, a distance 193 between the inlet port 185 and shield 140 is greater than about 25 percent of a distance 194 between the shield 140 and an outer wall 195 opposing the shield 140. In some cases, the inlet port 185 is located under or near the anode 125. As illustrated in FIG. 2 one or more inlet port 185 can be located in a floor 205 of the reservoir 105, however, in other cases, one or more the inlet port 185 can be located in walls 160, 162, 195 of the reservoir 105.

Figure 5:
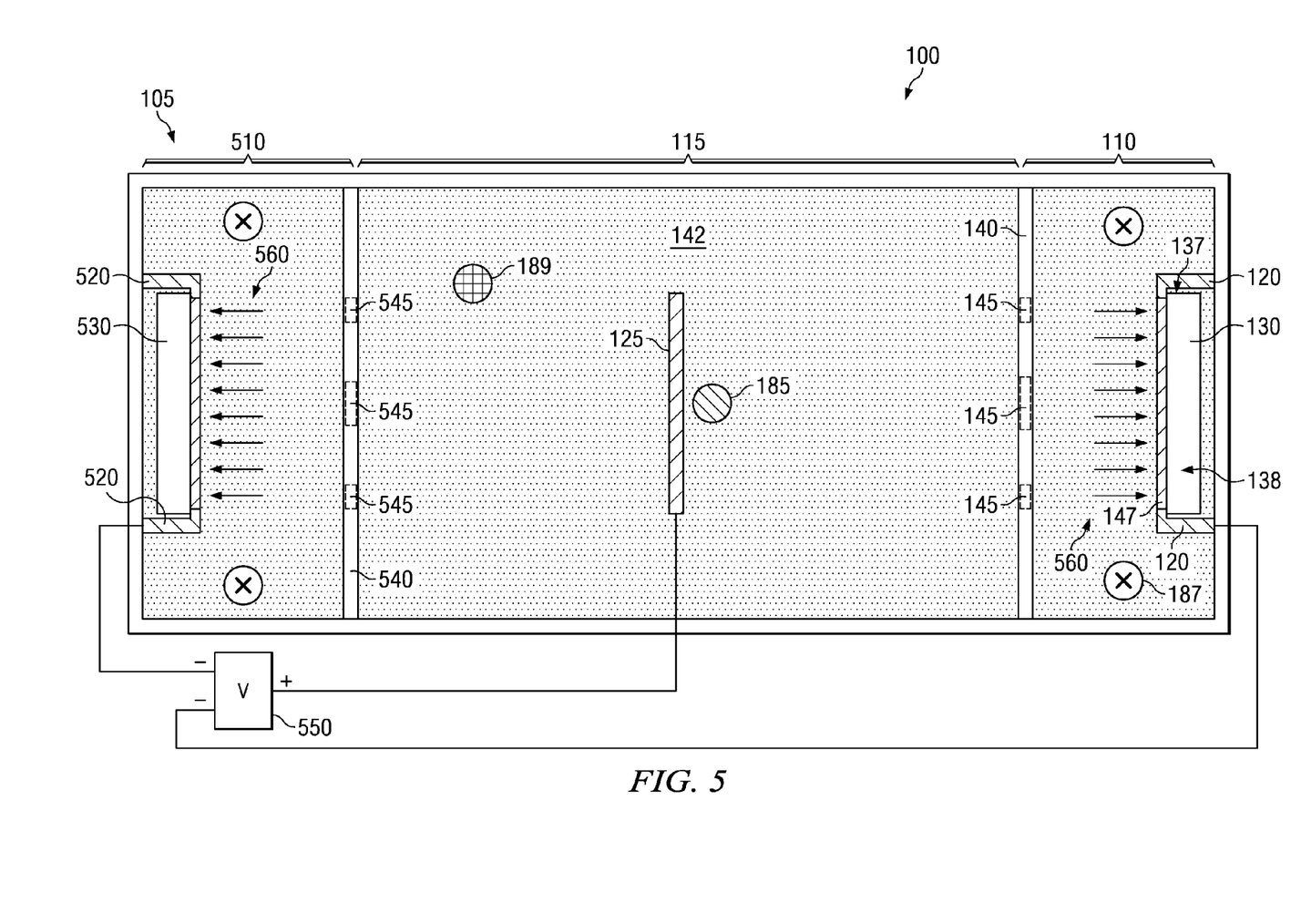
FIG. 5 presents a plan view of an alternative example multi-chambered system of the disclosure.

In some cases, it is advantageous for the multi-chambered ECD system 100 to have a plurality of substrate-holding chambers so that metal can be simultaneously deposited onto multiple substrates. FIG. 5 presents a plan view of an alternative example multi-chambered system 100 of the disclosure having a third chamber 510. The third chamber 510 has a second cathode 520. A second semiconductor substrate 530 is locatable in the third chamber 510. Similar to that described above for the first chamber 110, the second cathode 520 is electrically coupled to the second semiconductor substrate 530. A second shield 540 separates the second chamber 115 and third chamber 510. Similar to that described above for the first chamber 110, the second shield 140 is configured to deter electric current flow 143 between the second and third chambers 115, 510, other than though second predefined openings 545 in the second shield 540.

As shown in FIG. 5, the second chamber 115 can be centrally located in the fluid reservoir 105. For example, the first chamber 110 can be one of a plurality of substrate-holding chambers 110, 510 peripherally located in the fluid reservoir 105. Each of the substrate-holding chambers 110, 510 can be configured to hold individual substrates 130, 530, cathodes 120, 520 and shields 140, 540. Centrally locating the second chamber 115 in this fashion facilitates locating a plurality of substrate-holding chambers 110, 510 in direct fluid communication with the second chamber 115.

Any embodiments of the multi-chambered system 100 of the disclosure can further include other components to facilitate the ECD of metal. For example, the system 100 shown in FIG. 5 can further include an electrical power supply 550 coupled to the cathodes 120, 520 and the anode 125. The electrical power supply 550 can be configured to provide a voltage (V) sufficient to produce an electrical field 560 through an electrolytic fluid 142 located in first and second chamber 110, 115. By virtue of the above-described configurations of the fluid reservoir 105, the electrical field 560 provides a uniform current density across the substrate 130, or substrates 130, 530. For example, in some cases, the difference in current density at the edge 137 versus the central region 138 of the substrate 130 is less than 200 percent. In other cases the For example, the difference in current density at the edge 137 versus the central region 138 of the substrate 130 is less than 5 percent. One skilled in the art would understand how current density or relative current density could be determined e.g., by measuring the rate or relative rate of metal layer 147 deposition at multiple locations 137, 138 on the substrate 130. For instance, the thickness of metal deposited at a location 137, 138 on the major surface 132 is proportional to the current density at that location.

Figure 6:
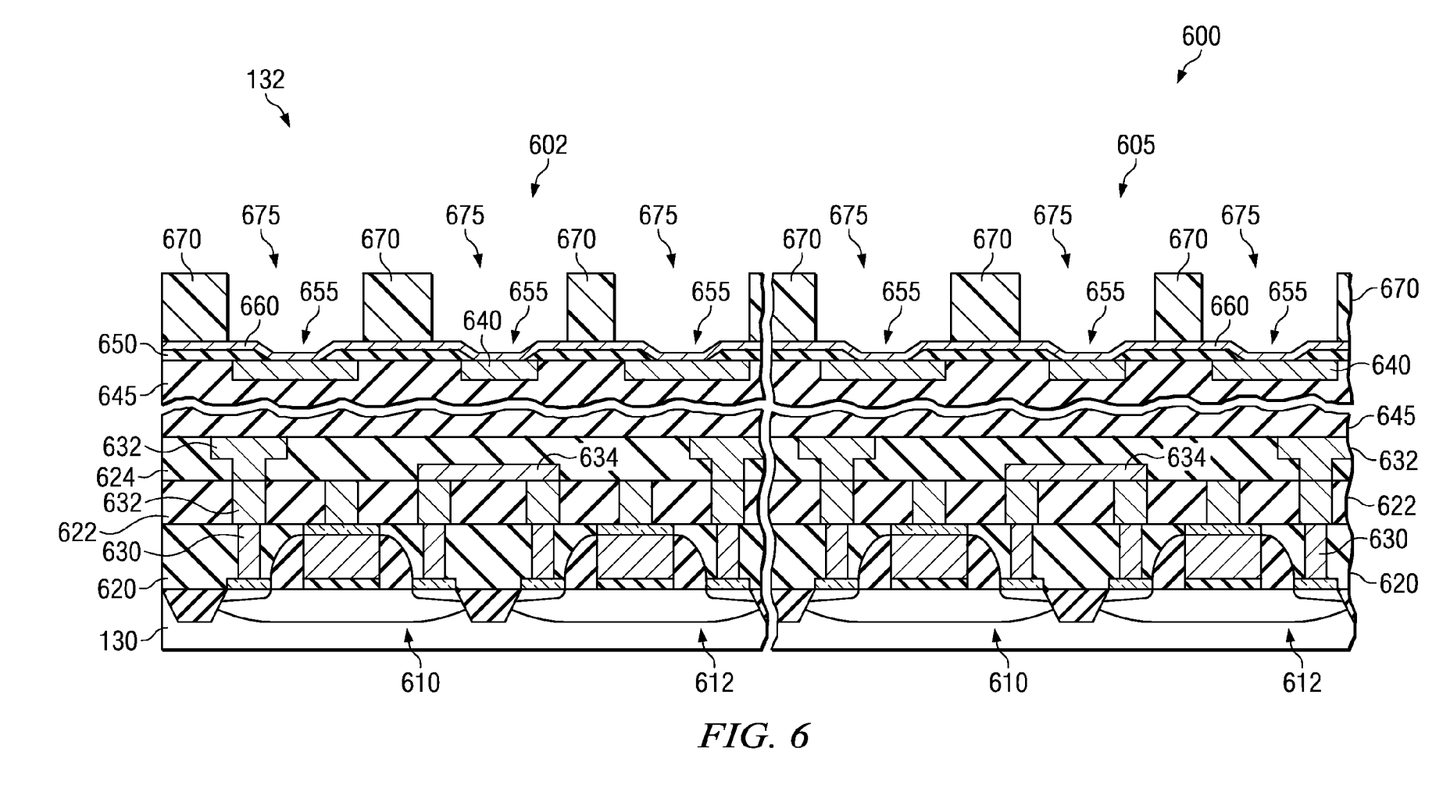
FIGS. 6-8 present selected steps in an example method of manufacturing semiconductor devices of the disclosure.
Figure 7:
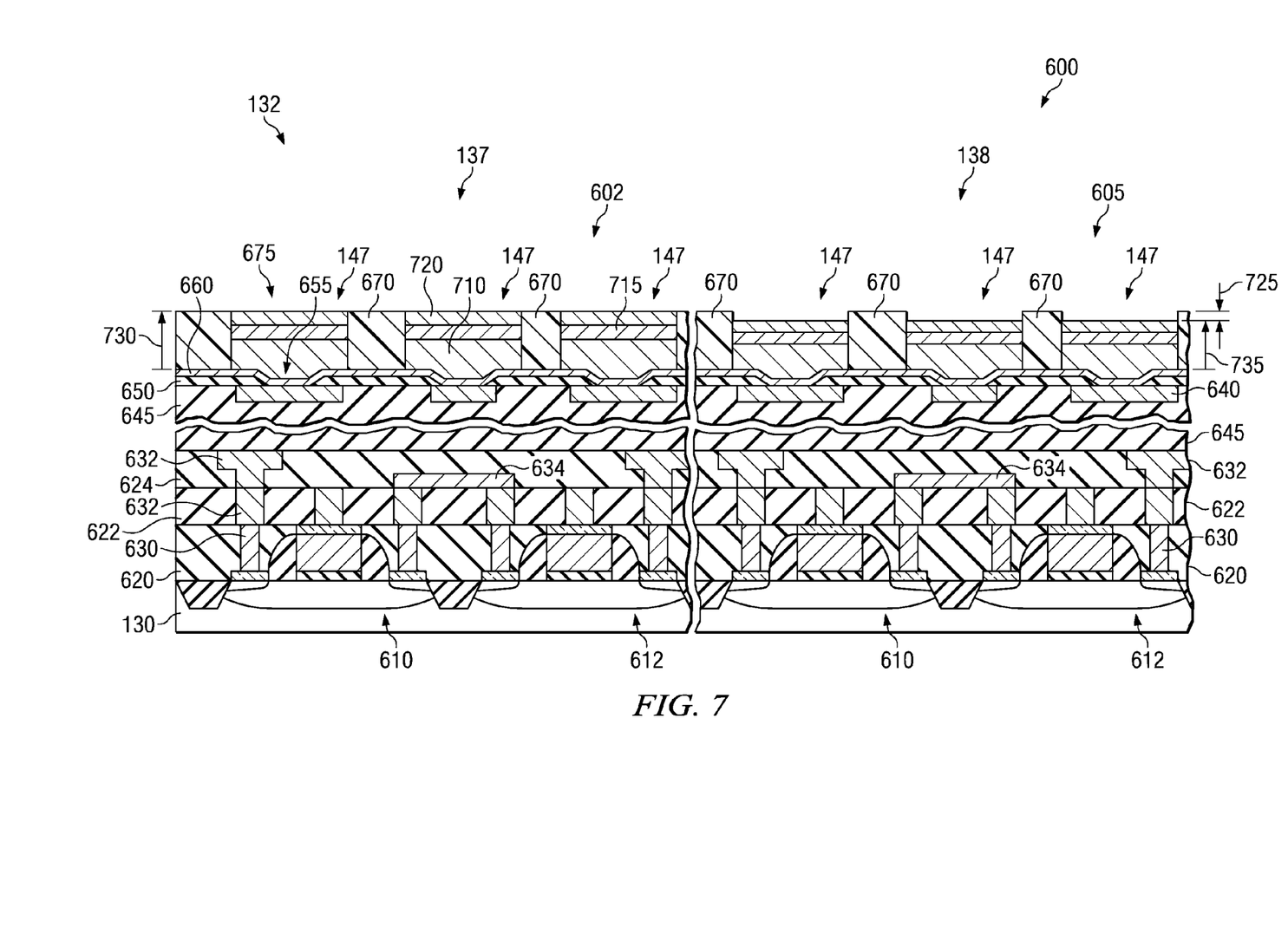
Figure 8:
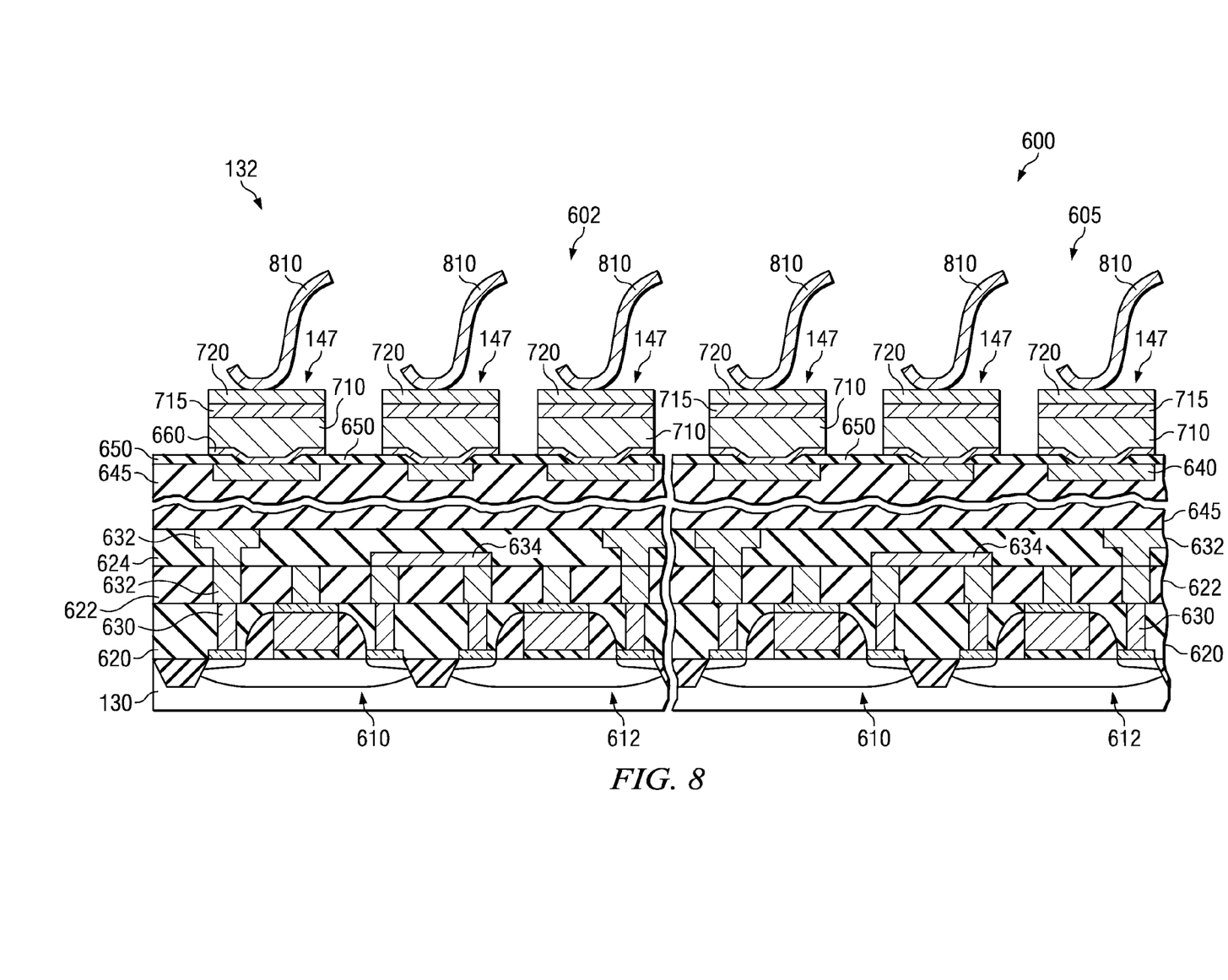

Another aspect of the present disclosure is a method of manufacturing semiconductor devices. FIGS. 6-8 present cross-sectional views of semiconductor devices 600 at selected stages of manufacture. Each of the semiconductor devices 600 can be an individual or a plurality of integrated circuits, or other semiconductor devices or electrical components that are intended to work together. Examples include logic or analog circuits, power amplifiers, electric filters, or other semiconductor devices or other electronic components well know to those skilled in the art. The method can include forming a plurality of ICs 602, 605 on a substrate 130 surface 132. The ICs 602, 605 can be located at different positions on the semiconductor substrate 130. For example, the ICs 602, 605 can be at or near the edge 137 and central region 138, respectively, of a 150 mm or 200 mm diameter silicon wafer substrate 130 (FIG. 1).

FIG. 6 shows the ICs 602, 605 after forming a plurality of active devices 610, 612 (e.g., metal oxide semiconductor (MOS) transistors, Junction Field Effect transistors, NPN or PNP bipolar transistors, or combinations thereof), insulating layers (e.g., pre-metal dielectric layer 620 and inter-dielectric layers 622, 624), and interconnect structures (e.g., metal contacts 630, vias 632, and lines 634) of the ICs 602, 605. As illustrated in FIG. 6, interconnect structures 640 (e.g., metal lines) are located on the uppermost insulating layer 645 of the each of the ICs 602, 605.

FIG. 6 also shows the ICs 602, 605 after depositing a non-electrically conductive protective overcoat layer 650 (e.g., silicon nitride or polyimide) on the uppermost layer insulating layer 645, and patterning the overcoat layer 650 to form openings 655 therein. The openings 655 are located and expose the interconnect structures 640 on the uppermost insulating layer 645. FIG. 6 also shows the ICs 602, 605 after depositing a metal seed layer 660 on the overcoat layer 650. For example, in some cases the seed layer 660 can comprise one or more layers of titanium, titanium tungsten alloy (TiW) or copper, successively sputter deposited on the overcoat layer 650.

FIG. 6 also shows the ICs 602, 605 after depositing and patterning a photoresist layer 670 on the substrate (e.g., on the seed layer 660). The photoresist layer 670 is patterned to form openings 675 that expose portions of the seed layer laying over the interconnect structures 640 on the uppermost insulating layer 645.

One skilled in the art would be familiar with how to form the structures shown in FIG. 6. For example, any of the processes described in U.S. Pat. No. 6,683,380, which is incorporated by reference in its entirety, could be used to form the above-described structures.

FIG. 7 shows the ICs 602, 605 after electrochemically depositing a metal layer 147 (e.g., a metal bonding layer) on the substrate 130 (e.g., directly on the seed layer 660). As illustrated, the metal layer 147 substantially fills the openings 675 in the photoresist layer 670 and opening 655 in the overcoat layer 650. ECD of the metal layer 147 can be facilitated by any of the embodiments of the systems 100 shown in FIGS. 1-5. Some embodiments of the metal layer 147 comprise one or more successively deposited metal layers. For example, for the embodiment shown in FIG. 7, the metal layer 147 comprises a successively deposited copper layer 710, nickel layer 715, and palladium layer 720. In other embodiments, other metals or metal alloys typically used in the fabrication of semiconductor devices can be deposited using the embodiments of the systems 100 such as shown in FIGS. 1-5.

As discussed above, it is desirable to deposit the metal layer 147 uniformly across the substrate 130. In some embodiments, e.g., at the completion of metal deposition, a maximum height difference 725 of the metal layer 147 across the substrate's surface 132 is less than or equal to about 10 microns. That is, heights 730, 735 of the metal layer 147 measured at multiple locations (e.g., edge 137 and center 138, FIG. 1) on the major surface 132 do not differ by more than about 10 microns.

Figure 9:
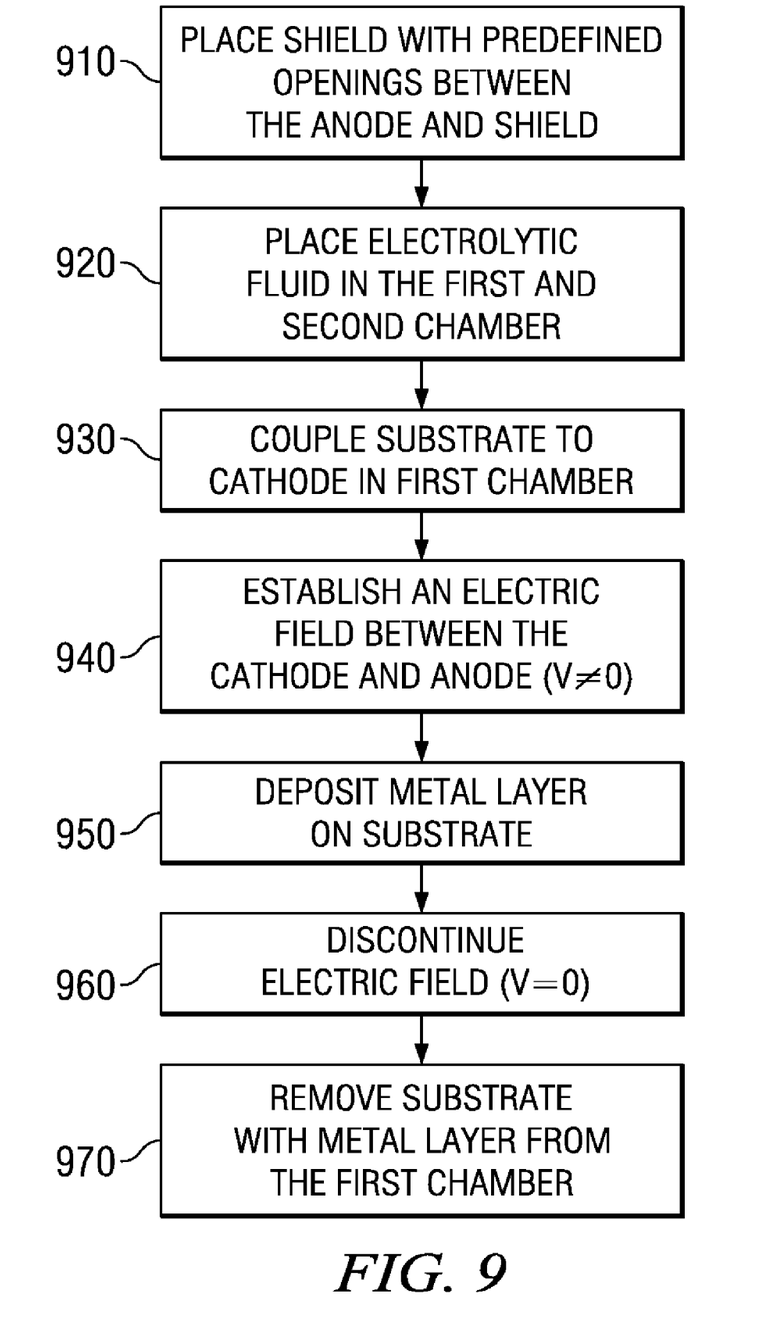
FIG. 9 presents a flow diagram of selected steps in the electrochemically deposition of a metal layer as part of the manufacture of the semiconductor devices shown in FIGS. 6-8.

FIG. 9 presents a flow diagram of selected steps in an example ECD of the metal layer 147 as part of the manufacture of the semiconductor devices shown in FIG. 7. With continuing reference to FIGS. 1, 2 and 5, in step 910, a shield 140 is placed between the cathode and anode 125 located in the first and second chambers 110, 115, respectively, of the fluid reservoir 105. Placing the shield 140 can include permanently coupling the shield 140 to walls 160, 162 and a floor 205 of the fluid reservoir 105, or removably coupling the shield to the walls 160, 162 and floor 205. The shield 140 is configured to deter peripheral current flow 143 between first and second chambers 110, 115, other than though the predefined openings 145 in the shield 140. In some embodiments, shields 140, 540 are configured to deter peripheral current flow the second chambers 115 and substrate containing chamber 110, 510, other than though the predefined openings 145 in the shields 140, 540.

In step 920, an electrolyte fluid 142 is placed in the first and second chambers 110, 115. The electrolyte fluid 142 can be an aqueous solution comprising conventional chemical used in ECD.

In step 930, the semiconductor substrate 130 is electrically coupled to a cathode 120 located in the first chamber 105. The semiconductor substrate 130 is located between the cathode 120 and the anode 125 located in the second chamber 115.

One skilled in the art would understand that the order of steps 910-930 could be changed and still be within the scope of the disclosed method. For example, the substrate 130 could be coupled to the cathode 120 as described in step 930 before the fluid 142 placed in the first and second chambers 110, 115 in step 920.

In step 940, an electric field 555 is established been the cathode and anode 120, 125, e.g., by applying a non-zero voltage (V#0) difference between the cathode and anode 120, 125. One or more metal layers 147 are thereby electrochemically deposited on the substrate 130, in step 950, while the electric field is maintained. For example, in some cases successive layers of copper, nickel and palladium can be deposited as discussed in the context of FIG. 7. When the metal layer 147 has been deposited to the desired thickness, the electric field is discontinued (e.g., V=0) in step 960, and the substrate 130 with the metal layer 147 thereon is removed from the first chamber 110 (step 970).

FIG. 8 shows the ICs 602, 605 after performing additional steps following the deposition of the metal layer 147 (FIGS. 7 and 8) to complete the IC's 602, 605 manufacture. For example, the photoresist layer 670 (FIG. 7) can be removed by conventional organic solvent wash processes. Portions of the seed layer 660 laying directly under the photoresist layer 670 can be removed by conventional wet etch processes. The IC 602, 605, can be separated from the substrate 130 using conventional dicing procedures. Wires 810 can be bonded to individual metal layers 147 of the ICs 602, 605 using conventional wiring bonding, ball bonding, stitch bonding, or other techniques well-known to those skilled in the art. The wires 810 can be further connected to a leadframe or conductive lines on a circuit board (not shown) that the ICs 602, 605 are mounted to in each of the devices 600. Further examples of such steps and other steps to complete the manufacture of ICs 602, 605 and the devices 600 are presented in the above-incorporated U.S. Pat. No. 6,683,380.

Those skilled in the art to which the disclosure relates will appreciate that other and further additions, deletions, substitutions, and modifications may be made to the described example embodiments, without departing from the disclosure.

What is claimed is:

1. An apparatus for electroplating a semiconductor substrate, the apparatus comprising:
    a first chamber having an inlet port that is adapted to provide a plating solution;
    a second chamber having a drain port that is adapted to drain the plating solution, wherein the first chamber is substantially adjacent to the first chamber;
    a shield that is located between the first and second chambers;
    a first electrode that is located in the first chamber;
    a second electrode that is located in the second chamber, wherein the semiconductor substrate is adapted to be electrically coupled to the second electrode and be separated from the shield by a distance; and
    a plurality of openings formed in the shield that allow for fluid communication between the first and second chambers, wherein the plurality of openings are arranged in a pattern area such that an electric field formed between the first electrode and the semiconductor substrate through the plating solution produces a substantially uniform current density across a target area of the semiconductor substrate at the distance, and wherein the pattern area is substantially oval having a major axis, a minor axis, and a center, and wherein the plurality of openings includes:
        a first opening formed along at least a portion of the major axis of the pattern area, wherein the first opening is elongated;
        a second opening formed along at least a portion of the minor axis of the pattern area, wherein the second opening is elongated, and wherein the first and second openings intersect at the center of the pattern area;
        a third opening that is substantially adjacent to the periphery of the pattern area along the minor axis of the pattern area, wherein the third opening is substantially circular; and
        a set of fourth openings arranged in a symmetrical pattern, wherein each fourth opening is substantially adjacent to the periphery of the pattern area, and wherein each fourth opening is substantially circular.

2. The apparatus of claim 1, wherein the distance further comprises a first distance, and wherein the first electrode is separated from shield by a second distance, and wherein the second distance is greater than the first distance.

3. The apparatus of claim 1, wherein the pattern area is smaller than the target area.

4. The apparatus of claim 1, wherein the first electrode is an anode and the second electrode is a cathode.

5. The apparatus of claim 4, wherein the third opening has a first diameter, and wherein each fourth opening has a second diameter, and wherein the second diameter is greater than the first diameter.

6. The apparatus of claim 5, wherein the first opening extends across the entire length of the major axis of the pattern area.

7. An apparatus for electroplating a semiconductor substrate, the apparatus comprising:
    a first chamber having an inlet port that is adapted to provide a plating solution;
    a second chamber having a drain port that is adapted to drain the plating solution, wherein the first chamber is substantially adjacent to the first chamber;
    a shield that is located between the first and second chambers;
    a first electrode that is located in the first chamber;
    a second electrode that is located in the second chamber, wherein the semiconductor substrate is adapted to be electrically coupled to the second electrode and be separated from the shield by a first distance; and
    a plurality of openings formed in the shield that allow for fluid communication between the first and second chambers, wherein the plurality of openings are arranged in a pattern area such that an electric field formed between the first electrode and the semiconductor substrate through the plating solution produces a substantially uniform current density across a target area of the semiconductor substrate at the first distance, and wherein the pattern area is substantially circular having a center, and wherein the plurality of openings includes:
a first opening that is substantially adjacent to the periphery of the pattern area along its entire length, wherein the first opening is elongated;
a plurality of second openings, wherein each second opening is substantially adjacent to the periphery of the pattern area along at least a portion of its length, the majority of the length of each second opening is offset from the periphery of the pattern area, and wherein each second opening is elongated; and
a plurality of third openings formed in a symmetrical pattern, wherein each third opening is elongated, and wherein each third opening is separated from the center of the pattern area by at least a second distance.

8. The apparatus of claim 7, wherein the first electrode is an anode and the second electrode is a cathode.

9. The apparatus of claim 8, wherein the first opening has a first width, and wherein each second opening has a second width, and wherein each third opening has a third width.

10. The apparatus of claim 9, wherein the first width is between about 1 cm to about 2.6 cm, and wherein the second width is between about 1 cm to about 2.6 cm, and wherein the third width is about 1 cm to about 1.5 cm.

11. The apparatus of claim 10, wherein the second distance is between about 3 cm to about 4 cm.

12. An apparatus for electroplating a plurality of semiconductor substrates, the apparatus comprising:
a fluid reservoir having a first chamber, a second chamber, and a third chamber;
a first shield that is located between the first chamber and the second chamber;
a second shield that is located between the second chamber an the third chamber
a first set of openings located in the first shield that allows for fluid communication between the first and second chambers, wherein the first set of openings includes:
a first pattern area that is substantially oval having a major axis, a minor axis, and a center;
a first opening formed along at least a portion of the major axis of the first pattern area, wherein the first opening is elongated;
a second opening formed along at least a portion of the minor axis of the first pattern area, wherein the second opening is elongated, and wherein the first and second openings intersect at the center of the first pattern area;
a third opening that is substantially adjacent to the periphery of the first pattern area along the minor axis of the first pattern area, wherein the third opening is substantially circular; and
a set of fourth openings arranged in a symmetrical pattern, wherein each fourth opening is substantially adjacent to the periphery of the first pattern area, and wherein each fourth opening is substantially circular;
a second set of openings located in the second shield that allows for fluid communication between the second and third chambers, wherein at least one of the openings from the second set of openings is elongated;
a first electrode that is located the second chamber;
a second electrode that is located in the first chamber, wherein a first semiconductor substrate of the plurality of semiconductor substrates is adapted to be electrically coupled to the second electrode and be separated from the first shield by a first distance, and wherein a first electric field formed between the first electrode and the first semiconductor substrate through a plating solution and the first set of openings produces a first substantially uniform current density across a first target area of the first semiconductor substrate at the first distance; and
a third electrode that is located in the third chamber, wherein a second semiconductor substrate of the plurality of semiconductor substrates is adapted to be electrically coupled to the third electrode and be separated from the second shield by a second distance, and wherein the second set of openings is arranged in a second pattern area such that a second electric field formed between the first electrode and the first semiconductor substrate through the plating solution produces a second substantially uniform current density across a second target area of the second semiconductor substrate at the second distance.

13. The apparatus of claim 12, wherein the first electrode is an anode, and the second and third electrodes are cathodes.

14. The apparatus of claim 13, wherein the apparatus further comprises:
an inlet port that is located in the second chamber, wherein the inlet port is adapted to provide the plating solution;
a first drain port that is located in the first chamber, wherein the first drain port is adapted to drain the plating solution; and
a second drain port that is located in the third chamber, wherein the second drain port is adapted to drain the plating solution.

15. The apparatus of claim 14, wherein the second pattern area is substantially oval having a major axis, a minor axis, and a center wherein the second set of openings further comprises:
a fifth opening formed along at least a portion of the major axis of the second pattern area, wherein the fifth opening is elongated;
a sixth opening formed along at least a portion of the minor axis of the second pattern area, wherein the sixth opening is elongated, and wherein the fifth and sixth openings intersect at the center of the second pattern area;
a seventh opening that is substantially adjacent to the periphery of the second pattern area along the minor axis of the second pattern area, wherein the seventh opening is substantially circular; and
a set of eighth openings arranged in a symmetrical pattern, wherein each eighth opening is substantially adjacent to the periphery of the second pattern area, and wherein each fourth opening is substantially circular.

16. The apparatus of claim 15, wherein the seventh opening has a third diameter, and wherein each eighth opening has a fourth diameter, and wherein the fourth diameter is greater than the third diameter.

17. The apparatus of claim 16, wherein the fifth opening extends across the entire length of the major axis of the second pattern area.

18. The apparatus of claim 14, wherein the second pattern area is substantially circular having a center, and wherein the second set of openings further comprises:
a fifth opening that is substantially adjacent to the periphery of the second pattern area along its entire length, wherein the fifth opening is elongated;
a plurality of sixth openings, wherein each sixth opening is substantially adjacent to the periphery of the second pattern area along at least a portion of its length, and wherein each sixth opening is elongated; and
a plurality of seventh openings formed in a symmetrical pattern, wherein each seventh opening is elongated, and wherein each seventh opening is separated from the center of the second pattern area by at least a second distance.

19. The apparatus of claim 18, wherein the fifth opening has a first width, and wherein each sixth opening has a second width, and wherein each seventh opening has a third width.

20. The apparatus of claim 19, wherein the first width is between about 1 cm to about 2.6 cm, and wherein the second width is between about 1 cm to about 2.6 cm, and wherein the third width is about 1 cm to about 1.5 cm.

21. The apparatus of claim 20, wherein the second distance is between about 3 cm to about 4 cm.

\* \* \* \* \*